United States Patent [19]

Baran

[11] Patent Number: 5,686,871
[45] Date of Patent: Nov. 11, 1997

[54] METHOD FOR MINIMIZING RADIO FREQUENCY EMISSIONS FROM PLUG-IN ADAPTER CARDS IN COMPUTER SYSTEMS

[75] Inventor: Jozef B. Baran, Irvine, Calif.

[73] Assignee: AST Research, Inc., Irvine, Calif.

[21] Appl. No.: 678,888

[22] Filed: Jul. 12, 1996

[51] Int. Cl.⁶ .................. H05K 1/02; H05K 9/00
[52] U.S. Cl. .................................. 333/12; 333/181
[58] Field of Search .................. 333/12, 181; 361/799, 361/800, 818

[56] References Cited

U.S. PATENT DOCUMENTS

| | | |
|---|---|---|
| 2,754,484 | 7/1956 | Adams . |
| 3,398,232 | 8/1968 | Hoffman . |
| 3,680,005 | 7/1972 | Jorgensen et al. . |
| 4,490,690 | 12/1984 | Suzuki ............................ 333/1 |
| 4,498,122 | 2/1985 | Rainal . |
| 4,605,915 | 8/1986 | Marshall et al. ................ 333/238 |
| 4,658,334 | 4/1987 | McSparran et al. . |
| 4,689,442 | 8/1987 | Ozaki . |
| 4,845,311 | 7/1989 | Schreiber et al. ............... 174/36 |
| 4,954,929 | 9/1990 | Baran . |
| 5,068,631 | 11/1991 | Vince ........................ 333/12 X |
| 5,227,742 | 7/1993 | Suzuki ............................ 333/1 |
| 5,357,050 | 10/1994 | Baran et al. ................... 174/33 |
| 5,523,921 | 6/1996 | Van Lydegraf ................. 361/818 |

FOREIGN PATENT DOCUMENTS

| | | |
|---|---|---|
| 0027047 | 4/1981 | European Pat. Off. . |
| 239899 | 10/1986 | German Dem. Rep. . |

*Primary Examiner*—Paul Gensler
*Attorney, Agent, or Firm*—Knobbe, Martens, Olson & Bear, LLP

[57] ABSTRACT

Noise generated in a computer system on a modem adapter card is effectively suppressed by providing an extension to a voltage reference plane. The extension reference plane is coupled to the voltage reference plane of the adapter card by an impedance circuit. The extension reference plane causes the adapter card to have a composite reference plane which has an overall length greater than one-quarter of the wavelength of the signal to be suppressed such that the composite reference plane does not resonate at the frequency of the signal which generated the noise. The reference planes are preferably connected by a resonant circuit so that the two reference planes are effectively electrically connected at high frequencies and are electrically disconnected at low frequencies so that resonance of the boards is also suppressed at the lower frequencies.

15 Claims, 10 Drawing Sheets

METHOD FOR MINIMIZING RADIO FREQUENCY EMISSIONS FROM PLUG-IN ADAPTER CARDS IN COMPUTER SYSTEMS

BACKGROUND OF THE INVENTION

1. Field of the Invention

The present application is directed to the reduction of electromagnetic emissions from computer systems, and, more particularly, to the reduction of electromagnetic emissions on external signal lines connected to adapter cards.

2. Description of the Related Art

Microprocessor-based computer systems are found in a very high percentage of homes and offices. Such computer systems, often referred to as personal computers, desktop computers, notebook computers, or the like, operate at very high frequencies and typically have clock signals having frequencies in excess of 50 MHz, and often in excess in 100 MHz, or more. Such clock signals are generally square wave clock signals (e.g., signals having a 50% duty cycle of alternating high logic levels and low logic levels. As is well-known in the art, such clock signals generate harmonic signals (odd harmonics) which have significantly higher frequencies than the fundamental frequencies.

The Federal Communications Commission (FCC) has imposed strict rules regarding electromagnetic emissions from computer systems, particularly computer systems which are used in the home environment where the emissions can affect the reception of other signals by radio and television receivers. Thus, much effort has been expended on reducing such emissions, such as, for example, by enclosing the circuitry of a computer system in an electrically conductive enclosure which is typically maintained at earth ground potential. Other efforts have been made to reduce the emissions radiated from power cables and signal cables entering and exiting from the enclosures of computer systems.

A large percentage of computer systems now include modems which enable computer systems to communicate over standard telephone lines using either a digital communication format for transmitting data or using a facsimile transmission format for transmitting images. Many of such modems are manufactured as plug-in adapter cards which are positioned inside the computer enclosure and which communicate via a telephone line plugged into a socket which passes through a portion of the computer enclosure. Because of the telephone line connected to the modem and because of the high clock and signal frequencies within the computer enclosure, it has been found that the telephone line often operates as an antenna for transmitting high frequency electromagnetic energy. In some cases, the noise transmitted on the telephone line has unacceptably high magnitudes.

SUMMARY OF THE INVENTION

As a result of investigations into the causes of the noise on a particular modem adapter card, the inventor herein has discovered that the noise is caused by a resonant circuit formed by a voltage reference plane (e.g., a ground plane) on the adapter card and the computer enclosure into which the card is installed. In particular, the inventor has discovered that the combination of the telephone line, the voltage reference plane and the computer enclosure resonates at frequencies which correspond to odd harmonics of a clock signal or other high frequency signal in the computer enclosure. The resonating signal has a sufficient magnitude that the electromagnetic emission radiated via the telephone line is not acceptable.

The inventor has further discovered that the electromagnetic emissions radiated from the telephone line can be reduced substantially by changing the harmonic frequency of the adapter card to a frequency that is not an odd harmonic of the principal clock frequency in the computer enclosure. For example, the adapter card is modified to resonate at an even harmonic of the clock frequency or at another frequency which is not present in the enclosure. Because a typical clock signal is a square wave comprising substantially only odd harmonics of the clock frequency, resonance at the even harmonics does not cause a signal having a sufficiently large magnitude to cause interference. Because more than one odd harmonic of the clock frequency may have sufficient magnitude to cause unacceptable emissions, in preferred embodiments of the present invention, the circuit card adapter is configured to have different effective lengths for different frequencies so as to preclude resonance at two or more frequencies.

One aspect of the present invention is a method for reducing noise generated on an adapter card in a computer system. The adapter card comprises a first voltage reference plane having a first length corresponding to a quarter wavelength of a noise-generating signal having a noise frequency. The method comprises the step of providing a second voltage reference plane having a second length selected such that the first length and the second lengths have a total length which differs from the quarter wavelength or any multiple of the quarter wavelength. The method comprises the further step of coupling the first voltage reference plane to the second voltage reference plane with an impedance. The impedance is selected such that the first voltage reference plane and the second voltage reference plane are electrically coupled together at the noise frequency. Preferably, the impedance comprises a resonant inductor-capacitor circuit. The resonant circuit may advantageously be a series resonant circuit which resonates at the noise frequency so that the first reference plane and the second reference plane are electrically coupled at the noise frequency. Alternatively, the resonant circuit may be a parallel resonant circuit which resonates at a resonant frequency which is less than the noise frequency so that the first reference plane and the second reference plane are electrically decoupled at the resonant frequency and are electrically coupled at the noise frequency.

In certain embodiments, the method further includes the step of providing a third voltage reference plane. The third voltage reference plane is coupled to one of the first voltage reference plane and the second voltage reference plane by a second impedance. The third voltage reference plane operates to suppress noise at a second noise frequency. In one embodiment, the third reference plane is coupled to the first reference plane. Alternatively, the third reference plane is coupled to the second reference plane.

Another aspect of the present invention is an improved adapter card for use in a computer system. The adapter card includes a first voltage reference plane mounted on the adapter card. The first voltage reference plane is connected to a reference voltage in the computer system. The first voltage reference plane has a first length. The adapter card further includes a second voltage reference plane. The second voltage reference plane has a second length. An impedance couples the first voltage reference plane to the second voltage reference plane such that the first length and the second length are added together at a frequency of a noise signal to be suppressed to form an overall length which is greater than one-quarter of the wavelength of the noise signal. Preferably, the impedance comprises a resonant circuit. In one embodiment, the resonant circuit is a series inductor-capacitor resonant circuit which resonates at the frequency of the noise signal. In a second embodiment, the resonant circuit is a parallel inductor-capacitor resonant circuit which resonates at a frequency below the noise frequency to block signals at the frequency below the noise frequency and to pass the noise frequency such that the first reference plane and the second reference plane are electrically coupled at the frequency of the noise signal.

In certain embodiments, the adapter card advantageously includes a third reference plane electrically coupled to one of the first reference plane and the second reference plane. The third reference plane operates in combination with at least the first reference plane to suppress noise signals at a third frequency. In one embodiment, the third reference plane is coupled to the first reference plane. Alternatively, the third reference plane is coupled to the second reference plane.

A still further aspect of the present invention is a method of suppressing resonant noise on a circuit card in a computer system. The method comprises the step of constructing the circuit card to have a first voltage reference plane having a first length. The first length is shorter than a first resonant length for a first frequency of at least one low frequency signal present on the circuit card. The first length is approximately equal to a second resonant length of a second frequency of a higher frequency signal present on the circuit card. The method includes the further step of constructing a second voltage reference plane having a second length. The sum of the first length and the second length is greater than the second resonant length. The method includes the further step of coupling the first voltage reference plane to the second voltage reference plane at the second frequency to suppress resonance of the higher frequency signal.

BRIEF DESCRIPTION OF THE DRAWINGS

The present invention will be described below in connection with the accompanying drawing figures in which.

DETAILED DESCRIPTION OF THE PREFERRED EMBODIMENT

Figure 1:
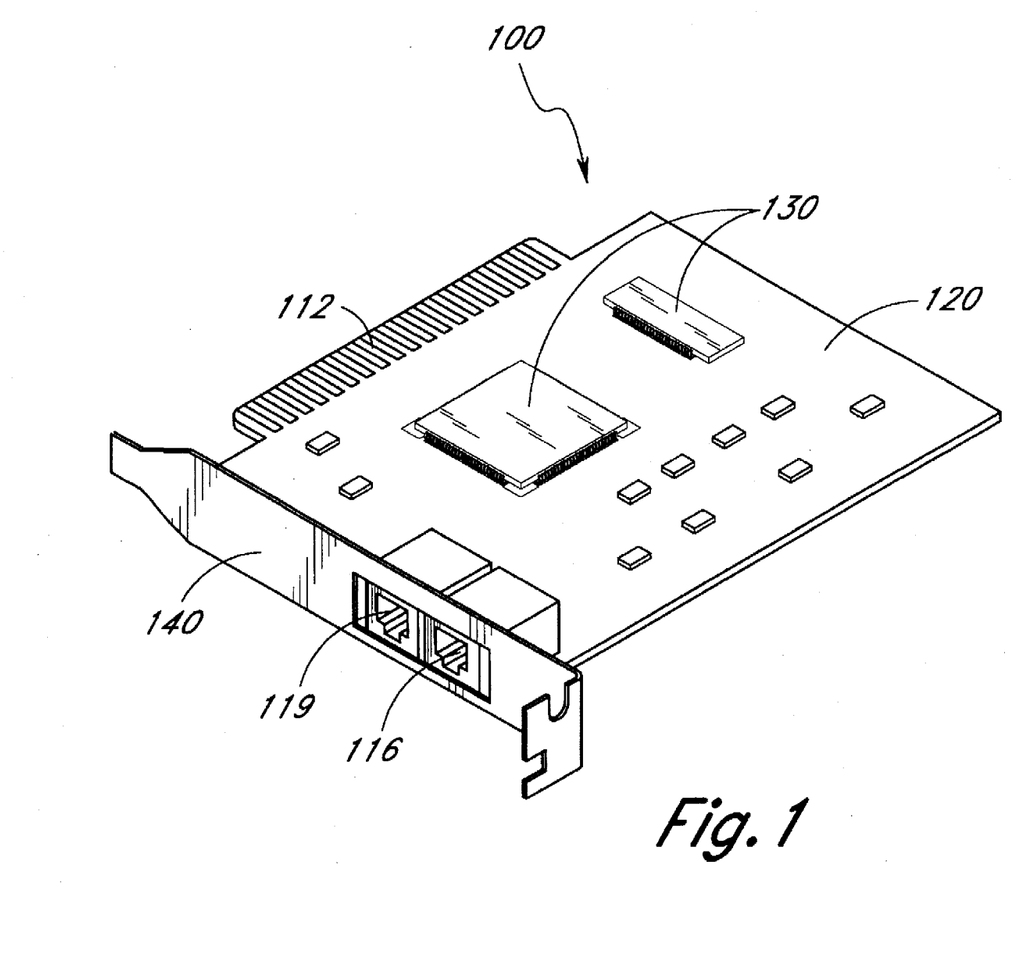
FIG. 1 is a perspective illustration of the component side of an exemplary conventional modem card showing the components thereon and the telephone connections thereto.
Figure 2:
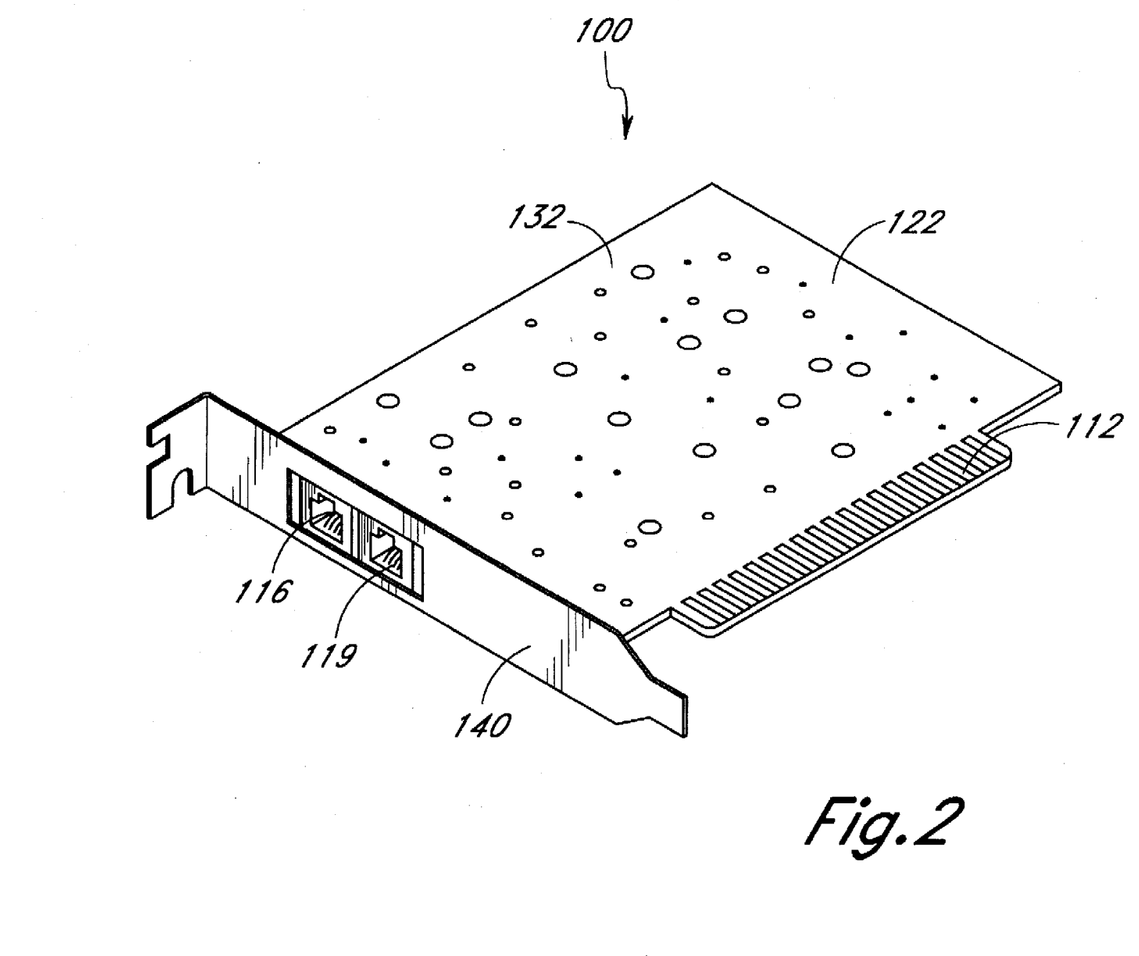
FIG. 2 is a perspective illustration of the solder side of the modem card of FIG. 1 showing the ground plane with openings therein.

FIGS. 1 and 2 illustrate an exemplary modem adapter card 100 which may be incorporated into a computer system in a conventional manner. The operation of such a modem adapter card 100 will not be described in detail herein because such modem adapter cards 100 are well known in the art. Briefly, the modem adapter card 100 is installed in a computer system enclosure 110 (FIG. 3) and is electrically connected to a computer system bus (not shown) via an edge connector 112 on the adapter card 100 and a mating connector 114 in the computer system enclosure 110. A socket 116 on the adapter card 100 receives a telephone line 118 which is connected to a telephone system (not shown). A second socket 119 can be used to connect further telephone components (not shown) to the telephone system. The modem adapter card 100 receives digital signals from the computer system within the enclosure 110 via the computer system bus (not shown), converts the digital signals to analog signals in accordance with a known modem communication standard (e.g., V.32), and transmits the analog signals to the telephone system via the telephone line 118. Similarly, the modem adapter card 100 receives analog signals via the telephone line 118 and converts the analog signals to digital signals which are communicated to the computer system within the enclosure 110 via the computer system bus (not shown).

As illustrated in FIGS. 1 and 2, the modem adapter card 100 comprises a component side 120 and a solder side 122. Generally, most of the components (e.g., integrated circuits, resistors, capacitors, inductors, and the like) are mounted on the component side. Components having leads which extend through the adapter card 100 are soldered to the adapter card 100 on the solder side; however, it should be understood that many components utilize surface mount technology, or the like, which does not require holes through the circuit board. Such components are soldered to the adapter card 100 on the component side rather than the solder side. Only a few components 130 are shown on the component side of the adapter card 100 because of the high level of integration used in current modems.

Figure 3:
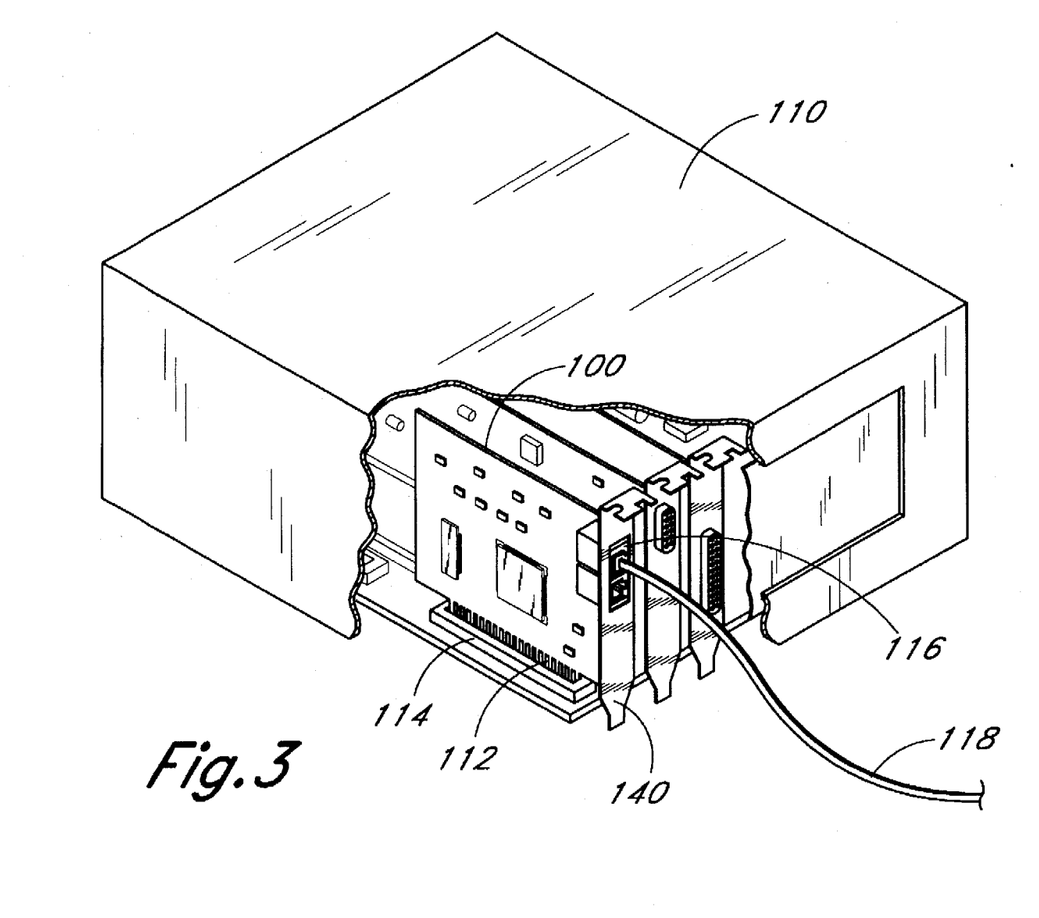
FIG. 3 is a perspective illustration of the adapter card of FIGS. 1 and 2 installed in an exemplary computer system.

As illustrated in FIG. 2, the solder side 122 of the adapter card 100 often comprises a substantial voltage reference plane 132 which covers most of the solder side 122 which is not penetrated by holes (vias) extending from the component side 120. The use of an extensive voltage reference plane 132 on a surface of the adapter card 100 and other such circuit cards is believed to be useful in reducing the electrical noise in a circuit card. Typically, the voltage reference plane 132 is electrically connected to a logic ground voltage reference supplied to the adapter card 100 via the computer system bus (not shown). In addition, when the voltage reference plane 132 is connected to logic ground, it is also electrically connected to a mounting bracket 140 which is mounted at one end of the adapter card 100. When the adapter card 100 is installed in the computer system 102, as illustrated in FIG. 3, the mounting bracket 140 mechanically couples the adapter card to the computer system 102 to hold it securely in place. Furthermore, the mounting bracket 140 electrically couples the voltage reference plane 132 (i.e., the ground plane) of the adapter card 100 to the chassis of the computer system enclosure 110. The mounting bracket 140 provides structural support for the telephone socket 116 so that the pressure applied to the socket 116 is absorbed by the computer system enclosure 110 rather than by the adapter card 100. Further, the mounting bracket 140 blocks the opening in the side of the computer system enclosure 110 to complete the electromagnetic shielding of the enclosure 110.

Although the above-described conventional construction of a microprocessor-based computer system is intended to substantially block electromagnetic emissions from the computer system, the inventor has determined that many such computer systems having a modem on an adapter card and having a telephone line connected to the modem is electromagnetically noisy. In particular, the inventor has found significant electromagnetic noise at particular frequencies (e.g., approximately 371 MHz and at 771 MHz for one particular adapter card and computer system combination). These frequencies are believed to be odd harmonics of frequencies which are present on the adapter card.

Figure 4:
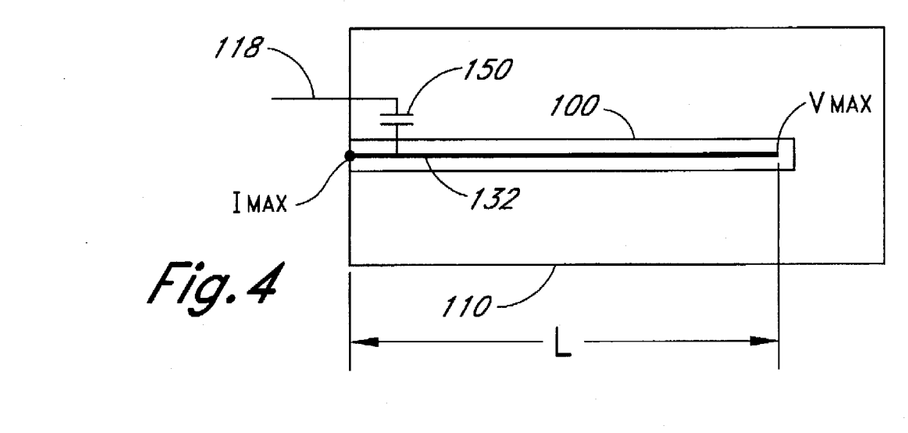
FIG. 4 is a highly simplified pictorial representation of the adapter card installed in the exemplary computer system which illustrates the resonant box effect of the card and the computer enclosure.

The inventor has further determined that the significant noise on the telephone line is caused by the voltage reference (e.g., ground) plane 132 of the adapter card 100. In particular, it is believed that the voltage reference plane 132 functions as an element of a resonant circuit formed within the computer enclosure 110. This is illustrated in FIG. 4, which is a highly simplified pictorial representation of the adapter card 100 installed in the exemplary computer enclosure 110. In particular, FIG. 4 illustrates the resonant box effect of the card and the computer enclosure. As shown in FIG. 4, computer enclosure 110 and the reference planes of surrounding adapter cards effectively form a box around the adapter card 100 and its reference plane 132. The reference plane 132 is electrically connected to the enclosure (i.e., box) 110 at one end thereof (the left end in FIG. 4). The telephone line 118 enters the box 110 proximate to the left end and is capacitively coupled to the reference plane 132. The opposite end of the reference plane 132 is suspended within the box 110. It can be seen that the resulting circuit has the appearance of a helical filter described in the literature. In particular, the telephone line 118 is capacitively coupled to the reference plane 132 via a cumulative capacitance represented by a capacitor 150. The capacitor 150 may represent stray coupling capacitances as well as actual capacitors on the adapter card 100. For example, the cumulative capacitance between the telephone line 118 and the ground reference plane 132 may be on the order of 470 picofarads.

Figure 5:
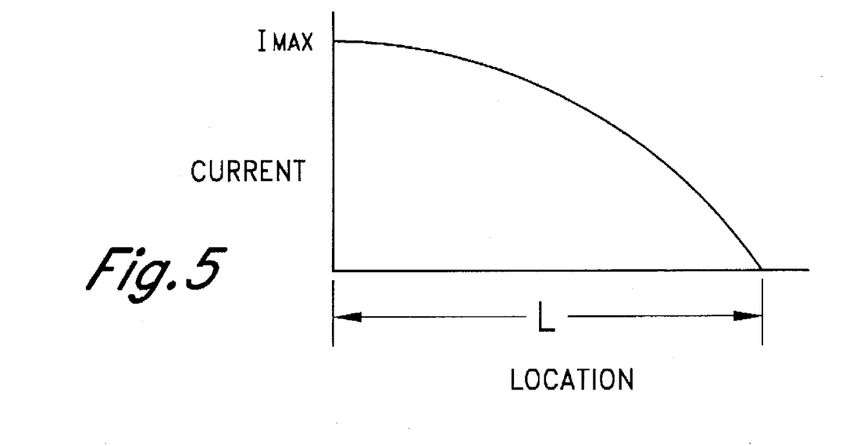
FIG. 5 is a graph of the current on the voltage reference plane of the adapter card at the resonant frequency showing the maximum current at the input socket and the minimum current at the opposite end.

The reference plane 132 will resonate at frequencies having wavelengths corresponding to the length of the reference plane. More particularly, the reference plane 132 will resonate at frequencies having quarter wavelengths corresponding to the length of the reference plane. FIG. 5 is a graph of the current on the voltage reference plane 132 of the adapter card 100 at the resonant frequency showing the maximum current at the end of the reference plane proximate to the telephone input socket 116 and the minimum current at the opposite end of the adapter card. Because the telephone line 118 is connected at the location of the maximum current, the telephone line 118 acts as an antenna to transmit the resonant signal and thus causes the noise problems. When the length of the adapter card 100 does not match the quarter wavelength of a particular signal, the maximum and minimum currents will not be at the respective ends of the reference plane 132, and the signal will not resonate. Thus, only those signals having quarter wavelengths which match the length of the reference plane 132 will resonate and develop signal levels sufficient to cause unacceptable electromagnetic interference which is coupled to the telephone line and transmitted externally to the enclosure 110.

Figure 6:
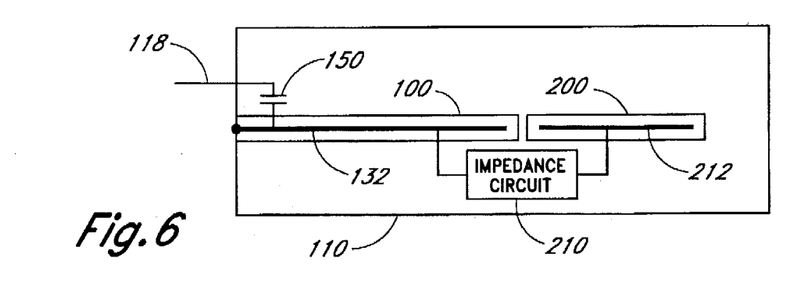
FIG. 6 illustrates a general embodiment of a solution to the noise problem wherein an extension portion of the adapter card is coupled to the main portion by an impedance circuit.

Having the adapter card 100 resonate at one or more frequencies, as described above, is not an acceptable condition, particularly when the signal levels at the resonant frequencies are greater than an allowable magnitude. FIG. 6 illustrates a general embodiment of a solution to the noise problem wherein an extension portion 200 is added to the adapter card 100 and is coupled to the main portion of the adapter card 100 by an impedance circuit 210. The extension portion includes a reference plane 212 which may be a solid reference plane. The impedance circuit 210 has the effect of extending the length of the reference plane 132 on the adapter card 100 by the length of the reference plane 212 of the extension portion 200 so that the reference plane 132 of the adapter card 100 is no longer resonant at the frequencies of interest. For example, if the adapter card 210 has an original length of 20 centimeters and originally supports a resonant frequency of 371 MHz because 20 centimeters is the length of one-quarter of the wavelength of a 371 MHz signal, then increasing the effective length of the reference plane 132 of the adapter card 100 by 10 centimeters suppresses resonance at 371 MHz because 30 centimeters does not correspond to one-quarter of the wavelength of the 371 MHz signal.

Simply increasing the length of the card is not an adequate solution because a longer card may be resonant at other lower frequencies which may be present in the computer system. By including an impedance between the main portion of the reference plane 132 of the adapter card 100 and the extension reference plane 212, a substantial portion of the energy between the two reference planes 132, 212 is absorbed and resonance is suppressed.

The length of the extension reference plane 212 is advantageously selected so that the effective length of the two reference planes 132, 212 corresponds to one-quarter of the wavelength of signal which does not appear in the computer system. For example, in the example presented herein, the reference plane 132 resonates at a frequency of 371 MHz with a length of 20 centimeters. By adding an extension reference plane 212 of length 20 centimeters, the effective length of the combined reference planes 132, 212 is 40 centimeters which is resonant at approximately 185 MHz. Assuming that no signals are present at 185 MHz, the combined reference planes will not develop any significant signal strength at that frequency, and no significant noise will be generated.

In order to further reduce the possibility of generating significant signal strength at a lower resonant frequency when the extension reference plane 212 is added, the impedance circuit is advantageously selected to block resonance at the lower frequency. This feature is illustrated in FIGS. 7 and 8 wherein the impedance circuit 210 comprises an inductor-capacitor resonant circuit.

Figure 7:
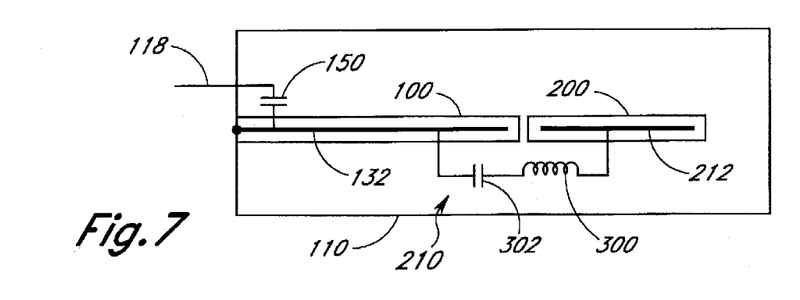
FIG. 7 illustrates a series resonant connection between the adapter card and the extension portion.
Figure 8:
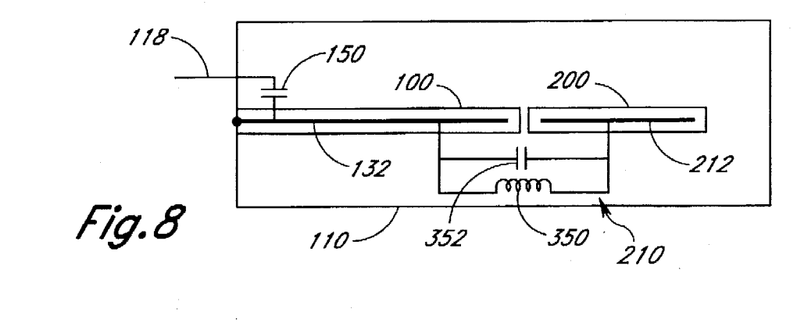
FIG. 8 illustrates a parallel resonant connection between the adapter card and the extension portion.

In FIG. 7, the resonant circuit 210 comprises an inductor 300 in series with a capacitor 302. The series LC impedance circuit 210 connects the reference plane 132 to the extension reference plane 212. The inductance of the inductor 300 and the capacitance of the capacitor 302 are selected to resonate at 371 MHz. At the resonant frequency, a series resonant circuit is effectively a short circuit (assuming low resistive impedance in the components). Thus, at 371 MHz, the reference plane 132 and the reference plane extension 212 are effectively connected together as a single reference plane. However, because the combined lengths of the two reference planes do not match the length of one-quarter of the wavelength of the 371 MHz signal, the two reference planes do not resonate to permit the 371 MHz signal to build up on the reference planes. Thus, the noise at 371 MHz is effectively suppressed.

Although the combined lengths of the two boards correspond to one-quarter of the wavelength of the 185 MHz signal, the two boards do not resonate at that frequency because the series resonant LC circuit 210 is not resonant at 185 MHz. Thus, the two boards are not effectively connected at 185 MHz. The reference plane 132 alone is too short to resonate at 185 MHz. Thus, if there is a signal present at 185 MHz, the reference plane 132 does not cause the signal to build up.

It can be seen from the foregoing that by connecting the series resonant circuit 210 between the two reference planes 132, 212, the resonance at the higher frequency is suppressed by effectively lengthening the reference plane at the higher frequency without causing resonance at a lower frequency.

FIG. 8 illustrates an embodiment wherein the impedance circuit 210 comprises a parallel resonant inductor-capacitor connection between the reference plane 132 on the adapter card 110 and the extension reference plane 212. In particular, an inductor 350 and a capacitor 352 are connected in parallel with each other and are connected between the reference plane 132 and the extension reference plane 212.

A parallel LC circuit has its maximum impedance at its resonant frequency. In this example, the inductance of the inductor 350 and the capacitance of the capacitor 352 are selected to resonate at 185 MHz. Thus, at 185 MHz, the two reference planes 132, 212 are effectively disconnected such that a signal at 185 MHz is affected only by the reference plane 132. As discussed above, the length of the reference plane 132 is not the resonant length for the 185 MHz signal. Thus, the 185 MHz signal will not build up. On the other hand, at frequencies above 185 MHz, the impedance of the capacitor 352 decreases such that the two reference planes are effectively connected together at 371 MHz. As discussed above, the combined lengths of the two reference planes 132, 212 is greater than one-quarter of the wavelength of the 371 MHz signal such that the two boards do not resonate at 371 MHz. Thus, the 371 MHz signal does not build up to a sufficient magnitude to cause noise problems.

The length of the extension plane can be selected in accordance with different criteria. In the previous example, the length was selected to suppress resonance at 371 MHz and to suppress resonance at 185 MHz. As an alternative, if a signal is determined to be a third harmonic of a clock signal on the adapter card 100 and the reference plane 132 has a length which resonates at the third harmonic frequency of the clock signal, the extension reference plane 212 can be constructed to have a length of approximately one-half the length of the reference plane 132 which will make the overall length of the two reference planes 132, 212 correspond to one-quarter of the wavelength of the second harmonic of the clock signal. Because a square wave clock signal has little or no energy in the second harmonic, there should be little signal build up at the second harmonic frequency. Any such build up can be further suppressed by coupling the reference plane 132 to the reference plane 212 by a parallel LC impedance circuit which is resonant at the second harmonic frequency so that the two reference planes are effectively isolated at the second harmonic frequency.

Figure 9:
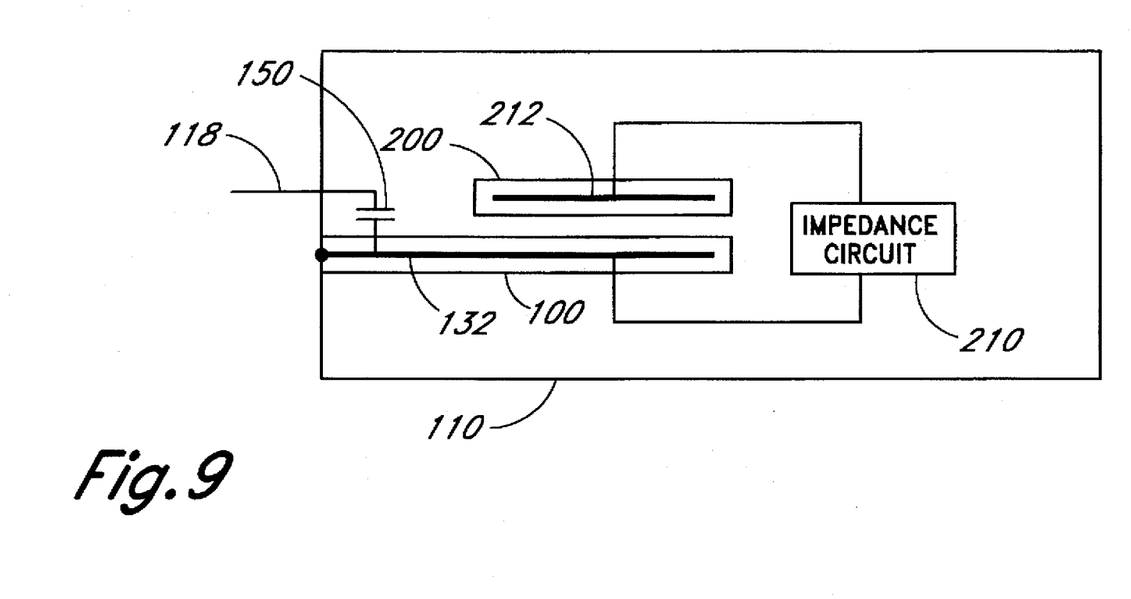
FIG. 9 illustrates a modified extension portion folded over the adapter card to reduce the overall length of the combined portions.

In some environments, the added length of the extension reference plane 212 cannot be accommodated within the space available in the enclosure 110. FIG. 9 illustrates a modified extension portion 212 which is folded over the adapter card 100 to reduce the overall length of the combined portions. Thus, the overall electrical length of the combined reference planes 132, 212 is increased without increasing the physical length of the adapter card 100.

Figure 10:
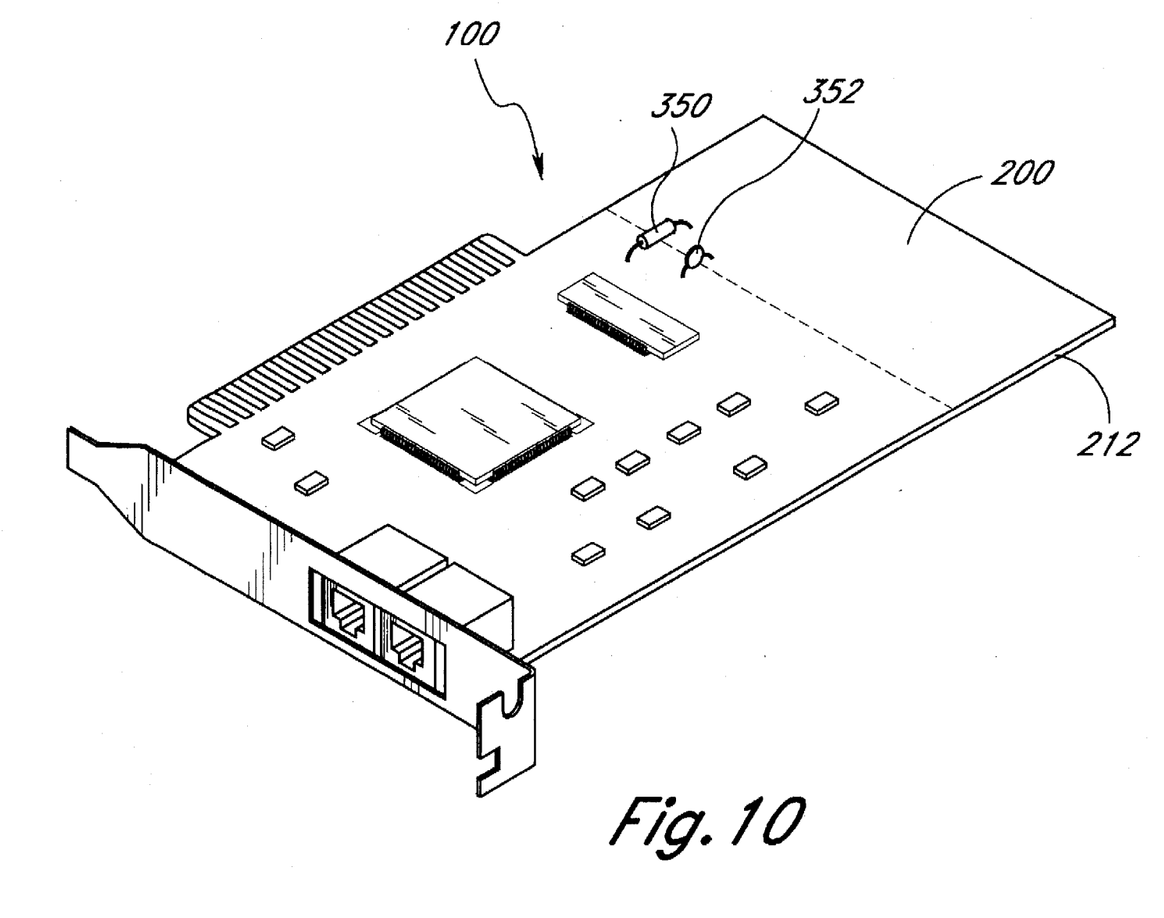
FIGS. 10 and 11 front and rear perspective illustrations, respectively, of one implementation of an adapter card incorporating the present invention showing the additional length of the voltage reference plane coupled to the main portion of the adapter card by a parallel resonant circuit.
Figure 11:
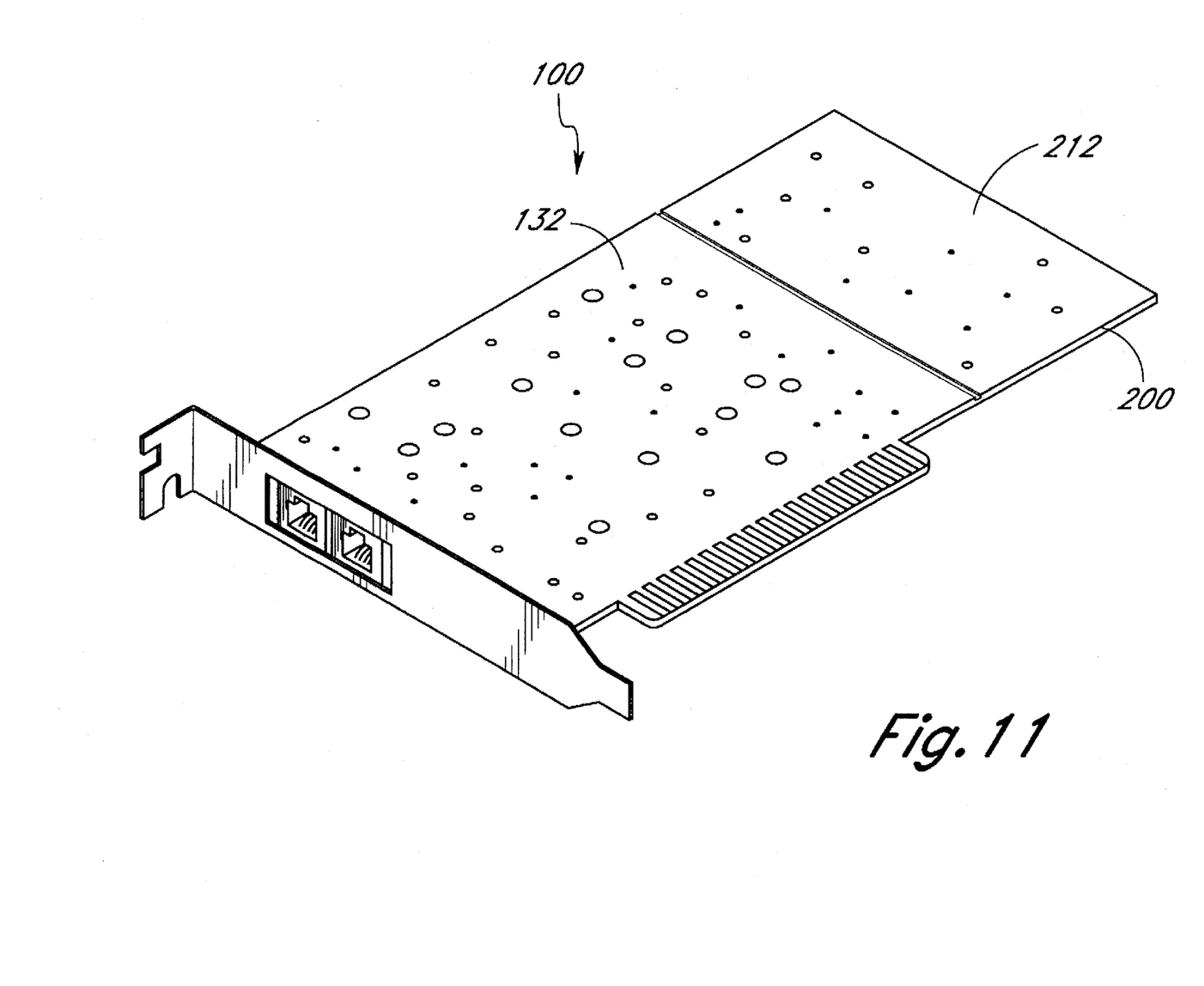

FIGS. 10 and 11 are front and rear perspective illustrations, respectively, of one implementation of an adapter card 100 incorporating the present invention showing the additional length of the voltage reference plane 212 coupled to the main portion of the adapter card 100 by the parallel resonant impedance circuit 210 of FIG. 8 comprising the inductor 350 and the capacitor 352. It should be understood that the capacitor 352 may comprise a discrete capacitor mounted between the two reference planes 132, 212 or it may be formed as part of the boundary between the two reference planes. In the embodiment shown in FIGS. 10 and 11, the extension plane 212 is formed on the same printed circuit board as the voltage reference plane 132. Alternatively, the extension reference plane 212 may be formed as a separate circuit board and attached to the adapter card 100 by suitable attachment devices (e.g., brackets) which are not shown in FIGS. 10 and 11.

Figure 12:
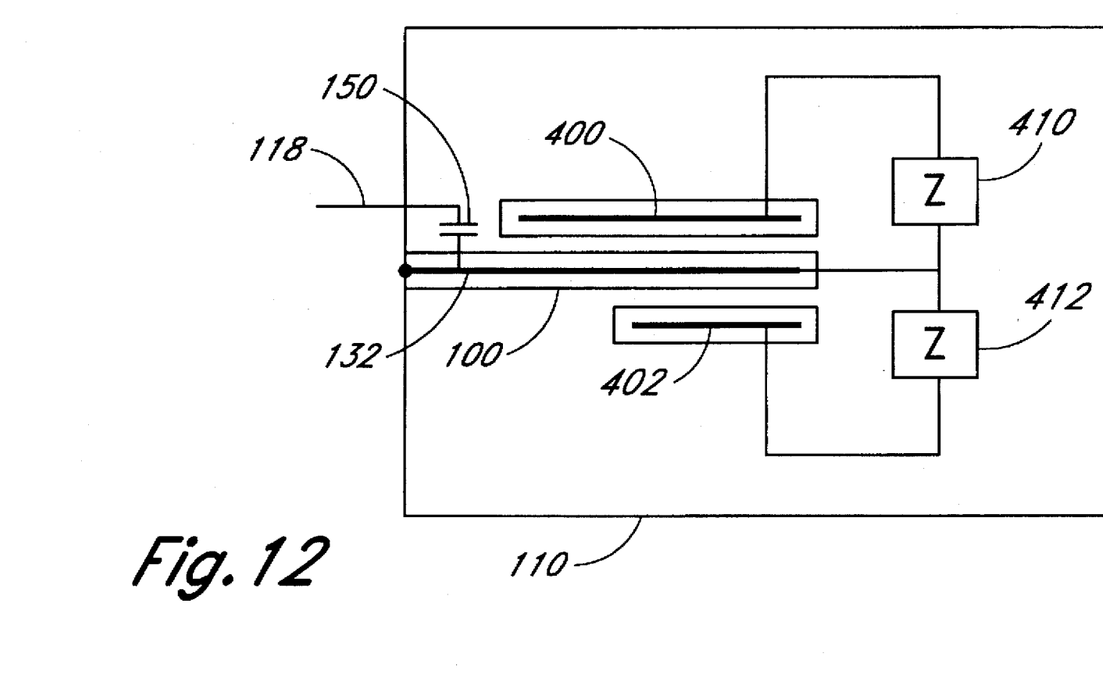
FIG. 12 illustrates an adapter card having two extension portions connected to the adapter card by respective impedance circuits.

FIG. 12 illustrates a further embodiment of the present invention in which a first extension reference plane 400 and a second extension reference plane 402 are coupled to the reference plane 132 by a respective first impedance circuit 410 and a respective second impedance circuit 412. The two extension reference planes 400, 402 may be of different lengths and coupled by impedance circuits which are resonant at different frequencies to thereby suppress noise at two different frequencies. Additional extension reference planes can also be provided to suppress noise at other frequencies.

Figure 13:
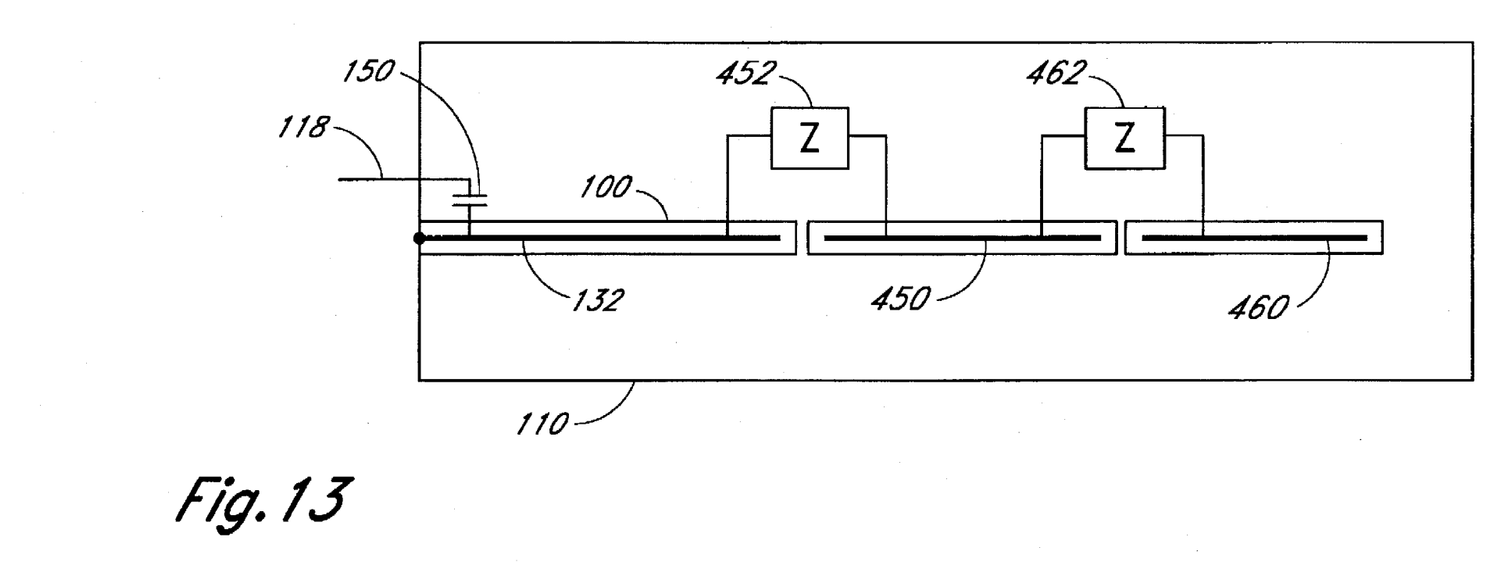
FIG. 13 illustrates an adapter card having two extension portions connected in series with the adapter card.

FIG. 13 illustrates a further embodiment in which a first extension reference plane 450 is coupled to the reference plane 132 by a first impedance circuit 452, and a second extension reference plane 460 is coupled to the first extension reference plane 450 by a second impedance circuit 462. The first extension reference plane 450 operates in combination with the reference plane 132 to suppress noise build up at a first frequency, as described above. In the event it is found that the reference plane 132 and the first extension reference plane 450 resonate at higher frequencies (i.e., the length of the combined planes 132, 450 correspond to an odd multiple of one-quarter of the wavelength of a higher frequency signal), the second extension reference plane 460 can be used to extend the combined length of the three planes 132, 450, 460 to a length which is not an odd multiple of one-quarter of the wavelength of the higher frequency signal. The second impedance circuit 462 can be selected to be a series LC resonant circuit which resonates at the higher frequency to thereby pass the higher frequency or it can be selected as a parallel LC resonant circuit which blocks the signal at the first frequency. Additional extension reference planes can be added to suppress resonance of signals at other frequencies.

Although described above in connection with particular embodiments of the present invention, it should be understood the descriptions of the embodiments are illustrative of the invention and are not intended to be limiting. Various modifications and applications may occur to those skilled in the art without departing from the true s spirit and scope of the invention as defined in the appended claims.

What is claimed is:

1. A method for reducing noise generated on an adapter card in a computer system, wherein said adapter card comprises a first voltage reference plane having a first length corresponding to a quarter wavelength of a noise-generating signal having a noise frequency, said method comprising the steps of:

providing a second voltage reference plane having a second length selected such that said first length and said second lengths have a total length which differs from said quarter wavelength or any multiple of said quarter wavelength; and coupling said first voltage reference plane to said second voltage reference plane with an impedance, said impedance selected such that said first voltage reference plane and said second voltage reference plane are electrically coupled together at said noise frequency.

2. The method as defined in claim 1, wherein said impedance comprises a resonant inductor-capacitor circuit.

3. The method as defined in claim 2, wherein said resonant inductor-capacitor circuit is a series resonant circuit which resonates at said noise frequency so that said first reference plane and said second reference plane are electrically coupled at said noise frequency.

4. The method as defined in claim 2, wherein said resonant inductor-capacitor circuit is a parallel resonant circuit which resonates at a resonant frequency which is less than said noise frequency so that said first reference plane and said second reference plane are electrically decoupled at said resonant frequency and are electrically coupled at said noise frequency.

5. The method as defined in claim 1, further including the step of providing a third voltage reference plane, said third voltage reference plane being coupled to one of said first voltage reference plane and said second voltage reference plane by a second impedance, said third voltage reference plane operating to suppress noise at a second noise frequency.

6. The method as defined in claim 5, wherein said third reference plane is coupled to said first reference plane.

7. The method as defined in claim 5, wherein said third reference plane is coupled to said second reference plane.

8. An improved adapter card for use in a computer system, said adapter card comprising:

a first voltage reference plane mounted on said adapter card, said first voltage reference plane connected to a reference voltage in said computer system, said first voltage reference plane having a first length;

a second voltage reference plane, said second voltage reference plane having a second length; and an impedance which couples said first voltage reference plane to said second voltage reference plane such that said first length and said second length are added together at a frequency of a noise signal to be suppressed to form an overall length which is greater than one-quarter of the wavelength of said noise signal.

9. The adapter card as defined in claim 8, wherein said impedance comprises a resonant circuit.

10. The adapter card as defined in claim 9, wherein said resonant circuit is a series inductor-capacitor resonant circuit which resonates at said frequency of said noise signal.

11. The adapter card as defined in claim 9, wherein said resonant circuit is a parallel inductor-capacitor resonant circuit which resonates at a frequency below said noise frequency to block signals at said frequency below said noise frequency and to pass said noise frequency such that said first reference plane and said second reference plane are electrically coupled at said frequency of said noise signal.

12. The adapter card as defined in claim 8, further including a third reference plane electrically coupled to one of said first reference plane and said second reference plane, said third reference plane operating in combination with at least said first reference plane to suppress noise signals at a third frequency.

13. The adapter card as defined in claim 12, wherein said third reference plane is coupled to said first reference plane.

14. The adapter card as defined in claim 12, wherein said third reference plane is coupled to said second reference plane.

15. A method of suppressing resonant noise on a circuit card in a computer system, said method comprising the steps of:

constructing said circuit card to have a first voltage reference plane having a first length, said first length being shorter than a first resonant length for a first frequency of at least one low frequency signal present on said circuit card, said first length being approximately equal to a second resonant length of a second frequency of a higher frequency signal present on said circuit card;

constructing a second voltage reference plane having a second length, the sum of said first length and said second length being greater than said second resonant length; and coupling said first voltage reference plane to said second voltage reference plane at said second frequency to suppress resonance of said higher frequency signal.

* * * * *